(12) United States Patent
Zang et al.

(10) Patent No.: US 9,425,252 B1
(45) Date of Patent: Aug. 23, 2016

(54) PROCESS FOR SINGLE DIFFUSION BREAK WITH SIMPLIFIED PROCESS

(71) Applicant: GLOBALFOUNDRIES Inc., Grand Cayman (KY)

(72) Inventors: Hui Zang, Albany, NY (US); Bingwu Liu, Ballston Spa, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/609,653

(22) Filed: Jan. 30, 2015

(51) Int. Cl.

| | | |
|---|---|---|
| H01L 21/336 | (2006.01) | |
| H01L 21/00 | (2006.01) | |
| H01L 21/84 | (2006.01) | |
| H01L 21/76 | (2006.01) | |
| H01L 21/70 | (2006.01) | |
| H01L 29/06 | (2006.01) | |
| H01L 29/10 | (2006.01) | |
| H01L 21/762 | (2006.01) | |
| H01L 21/3105 | (2006.01) | |
| H01L 21/02 | (2006.01) | |
| H01L 21/311 | (2006.01) | |
| H01L 21/28 | (2006.01) | |
| H01L 29/66 | (2006.01) | |
| H01L 29/78 | (2006.01) | |
| H01L 21/8234 | (2006.01) | |

(52) U.S. Cl.
CPC ...... *H01L 29/0649* (2013.01); *H01L 21/02164* (2013.01); *H01L 21/28017* (2013.01); *H01L 21/31051* (2013.01); *H01L 21/31144* (2013.01); *H01L 21/762* (2013.01); *H01L 21/823481* (2013.01); *H01L 29/1079* (2013.01); *H01L 29/66795* (2013.01); *H01L 29/785* (2013.01)

(58) Field of Classification Search
CPC ............ H01L 29/0649; H01L 29/0653; H01L 21/31051; H01L 21/31144; H01L 21/31053; H01L 21/762; H01L 21/76229; H01L 29/66795; H01L 29/785; H01L 21/823481
USPC ......... 438/155, 294, 296, 218, 221, 424, 435; 257/510, 506, E21.546
See application file for complete search history.

(56) References Cited

U.S. PATENT DOCUMENTS

| | | | | |
|---|---|---|---|---|
| 5,593,928 | A * | 1/1997 | Lee ................................. | 438/291 |
| 2008/0242024 | A1* | 10/2008 | Sugioka ......................... | 438/259 |
| 2014/0252479 | A1* | 9/2014 | Utomo et al. ................. | 257/347 |
| 2014/0264572 | A1* | 9/2014 | Kim et al. ..................... | 257/331 |
| 2015/0147860 | A1* | 5/2015 | Kim et al. ..................... | 438/283 |

* cited by examiner

*Primary Examiner* — Fernando L Toledo
*Assistant Examiner* — Aaron Gray
(74) *Attorney, Agent, or Firm* — Ditthavong & Steiner, P.C.

(57) ABSTRACT

A method of forming a SDB including a protective layer or bilayer and the resulting device are provided. Embodiments include forming a SDB of oxide in a Si substrate; forming a nitride layer over the Si substrate; forming a photoresist over the SDB and a portion of the nitride layer; removing the nitride layer on opposite sides of the photoresist down to the Si substrate, leaving a portion of the nitride layer only under the photoresist; forming a gate above the SBD and the portion of the nitride layer.

9 Claims, 6 Drawing Sheets

PROCESS FOR SINGLE DIFFUSION BREAK WITH SIMPLIFIED PROCESS

TECHNICAL FIELD

The present disclosure relates to an isolation structure formation for fin-type field effect transistor (FinFET) devices. The present disclosure is particularly applicable to the formation of a single diffusion break (SDB).

BACKGROUND

Use of an SDB is a requirement of technology scaling. An SDB can be used to reduce the circuit area to enable the formation of high-density integrated circuits. However, SDB formation is very challenging with little process margin. The SDB must cover both edges of the active area. In current SDB designs, the gate spacers must cover the active area edges. Enlarging the gate would cause active area to active area leakage. One attempt to form an SDB with sufficient edge coverage includes an oxide SDB 101 formed in a silicon (Si) substrate 103 using a lithography mask, as depicted in FIG. 1.

A need therefore exists for methodology enabling a formation of a SDB device with sufficient cover of the active area edges without PC to CA leakage or shorts, and the resulting device.

SUMMARY

An aspect of the present disclosure is a method of forming a SDB with a protective layer or bilayer.

Another aspect of the present disclosure is a SDB device including a protective layer or bilayer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a SDB of oxide in a Si substrate; forming a nitride layer over the Si substrate; forming a photoresist over the SDB and a portion of the nitride layer; removing the nitride layer on opposite sides of the photoresist down to the Si substrate, leaving a portion of the nitride layer only under the photoresist; forming a gate above the SBD and the portion of the nitride layer.

Aspects of the present disclosure include forming the nitride layer to a thickness of 5 nanometer (nm) to 200 nm. Other aspects include forming the photoresist with a width greater than a maximum width of the SDB. Further aspects include forming an oxide layer over the nitride layer before forming the photoresist. Additional aspects include removing the oxide layer on the opposite sides of the photoresist, leaving a portion of the oxide layer only under the photoresist remaining. Another aspect includes forming a gate on the portion of the oxide layer above the SBD. Other aspects include comprising forming a silicon oxide ($SiO_2$) layer over the Si substrate prior to forming the nitride layer.

Another aspect of the present disclosure is method including: forming a SDB of oxide in a Si substrate; forming a nitride layer over the Si substrate; forming a photoresist layer on the nitride layer, the photoresist layer having an opening above the SDB and down to the nitride layer; forming a recess in the nitride layer through the opening; forming an oxide layer over the nitride layer and filling the recess; removing the nitride layer on opposite sides of the oxide layer down to the Si substrate, leaving a portion of the nitride layer only under the oxide layer; and forming a gate on the oxide layer over the SDB.

Aspects of the present disclosure include forming the nitride layer to a thickness of 5 nm to 200 nm. Other aspects include forming the opening above the SDB with a width greater than a maximum width of the SDB. Further aspects include forming the recess to a depth of 5 nm to 200 nm. Additional aspects include comprising planarizing the oxide layer down to the nitride layer before removing the nitride layer.

A further aspect of the present disclosure is a device including: an oxide SDB formed in a Si substrate; a nitride layer formed on the Si substrate; and a gate formed over the oxide SDB and the nitride layer. Aspects of the device include a width of the nitride layer being greater than a maximum width of the oxide SDB. Other aspects include the nitride layer being formed to a thickness of 5 nm to 200 nm. Further aspects include the gate being formed on the nitride layer. Additional aspects include an oxide layer being formed on the nitride layer. Another aspect includes the gate being formed on the oxide layer. Other aspects include a $SiO_2$ layer being formed between the Si substrate and the nitride layer. Further aspects include the $SiO_2$ layer being formed to a thickness of 1 nm to 10 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of insufficient active area edge cover attendant upon forming an oxide SDB in a silicon substrate.

Methodology in accordance with embodiments of the present disclosure includes a SDB of oxide formed in a Si substrate. A nitride layer is formed over the Si substrate and a photoresist is formed over the SDB and a portion of the nitride layer. The nitride layer is then removed on opposite sides of the photoresist down to the Si substrate, leaving a portion of the nitride layer only under the photoresist. Thereafter, a gate is formed above the SBD and the portion of the nitride layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2:
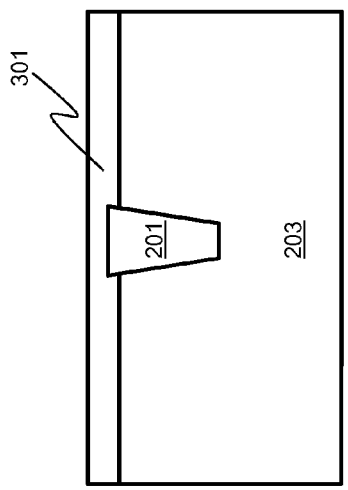
FIGS. 2 through 7 schematically illustrate a process flow for forming a SDB device including a protective layer, in accordance with an exemplary embodiment.
Figure 3:
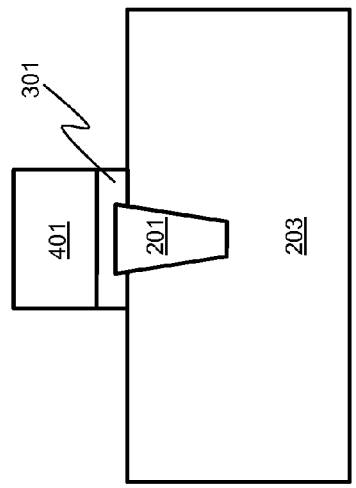
Figure 4:
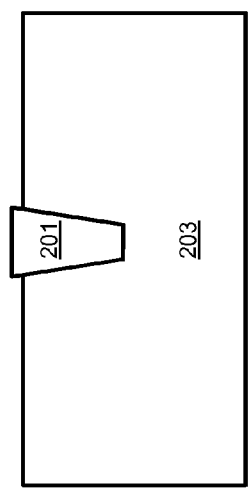
Figure 5:
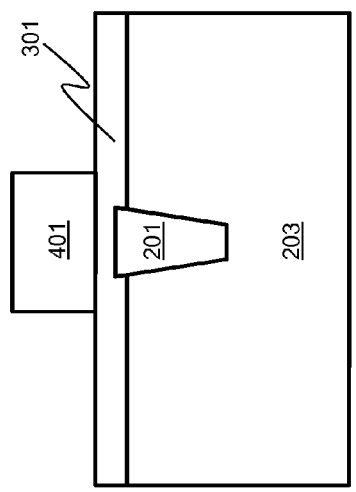
Figure 7:
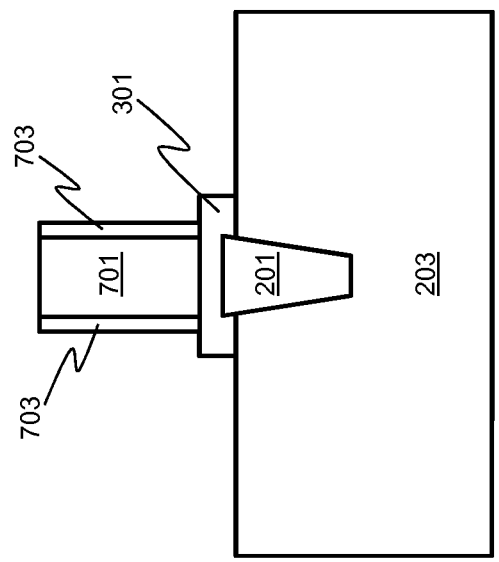
Figure 6:
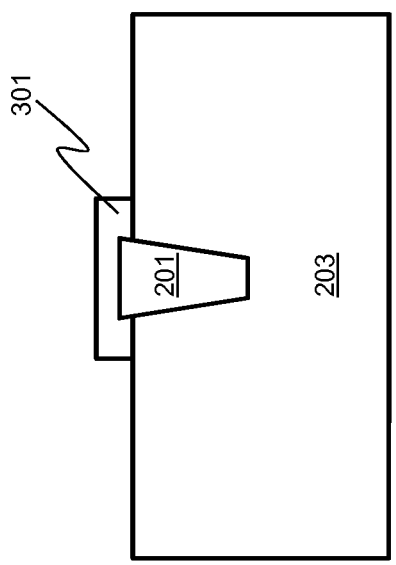
Figure 8:
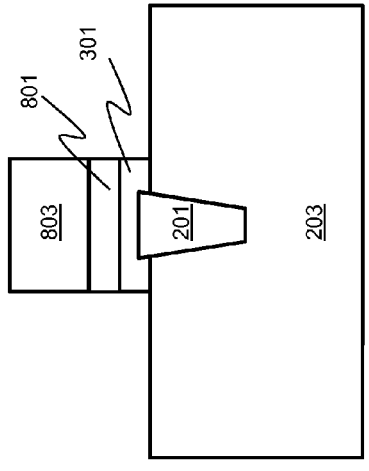
FIGS. 8 through 11 schematically illustrate a process flow for forming a SDB device including a protective bilayer, in accordance with an exemplary embodiment.
Figure 9:
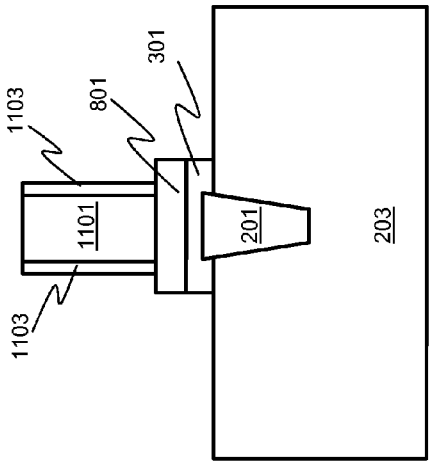
Figure 10:
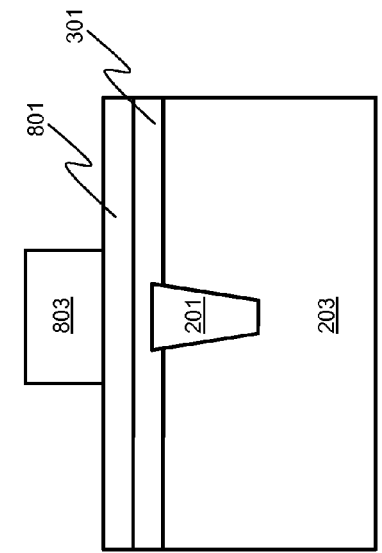

Adverting to FIG. 2, an oxide SDB 201 is formed in a Si substrate 203. Next, a nitride layer 301 is formed over the SDB 201 and the Si substrate 203, as depicted in FIG. 3. The nitride layer 301 may be formed, for example, to a thickness of 5 nm to 200 nm. Adverting to FIG. 4, a photoresist 401 is formed, for example, by patterning, over the nitride layer 301. The photoresist 401 is formed with a width greater than the width of the SDB 201 so that the nitride layer 301 will cover the entire SDB 201 after subsequent etching of the nitride layer 301. The nitride layer 301 is then removed on opposite sides of the photoresist 401 down to the Si substrate 203, for example, by etching, as depicted in FIG. 5. A $SiO_2$ etch-stop layer (not shown for illustrative convenience) may also be added between the Si substrate 203 and the nitride layer 301. The $SiO_2$ etch-stop layer may be formed, for example, to a thickness of 1 nm to 10 nm. Adverting to FIG. 6, the photoresist 401 is removed. Thereafter, a gate 701 with spacers 703 is formed on the nitride layer 301.

Figure 1:
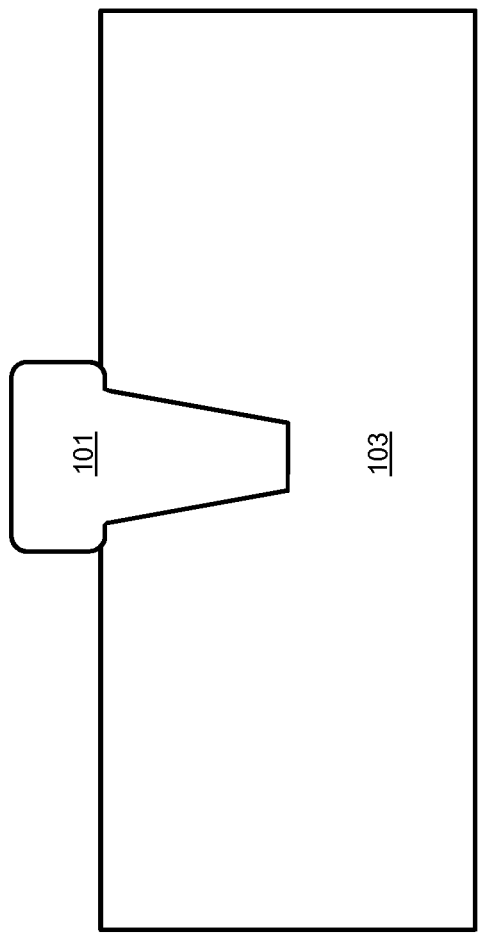
FIG. 1 schematically illustrates a background SDB device.
Figure 11:
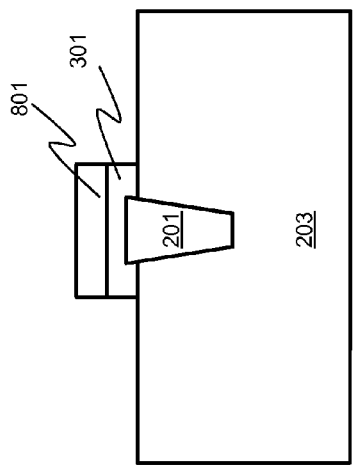
Figure 12:
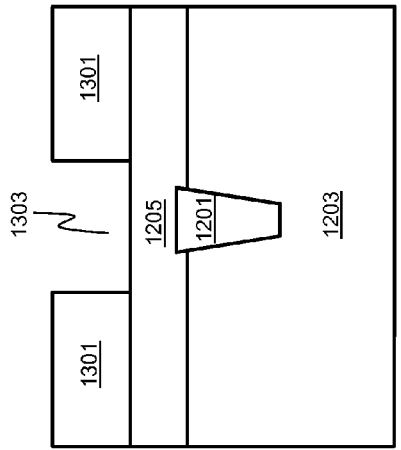
FIGS. 12 through 17 illustrate another process flow for forming a SDB device including a protective bilayer, in accordance with an exemplary embodiment.

FIGS. 8 through 11 schematically illustrate a similar process flow as FIGS. 2 through 7; however, a protective bilayer is formed instead between the gate and the SDB. Adverting to FIG. 8, following after the steps of FIGS. 1 through 3, an oxide layer 801 is formed on top of the nitride layer 301. The oxide layer 801 may be formed, for example, to a thickness of 5 nm to 200 nm. A photoresist 803, similar to the photoresist 401, is then formed on top of the oxide layer 801. The photoresist 803 is again formed with a width greater than the width of the SDB 201. Next, similar to the steps of FIG. 5, the nitride layer 301 and the oxide layer 801 are removed on opposite sides of the photoresist 803 down to the silicon substrate 203, for example, by etching. Again, a $SiO_2$ etch-stop layer (not shown for illustrative convenience) may also be added between the Si substrate 203 and the nitride layer 301. Adverting to FIG. 10, the photoresist 803 is removed. Thereafter, a gate 1101 and spacers 1103 are formed on the oxide layer 801, as depicted in FIG. 11.

Figure 13:
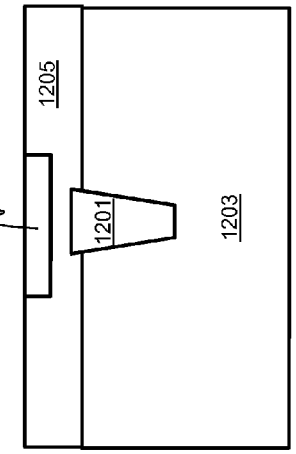
Figure 14:
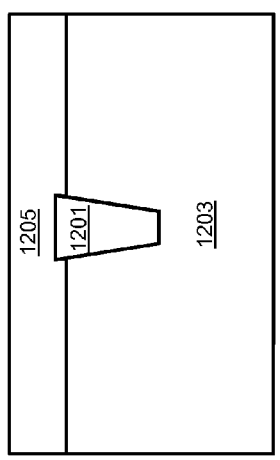
Figure 15:
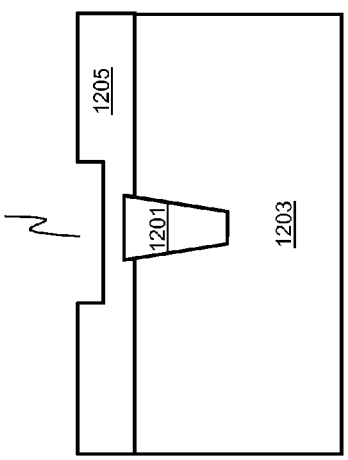
Figure 17:
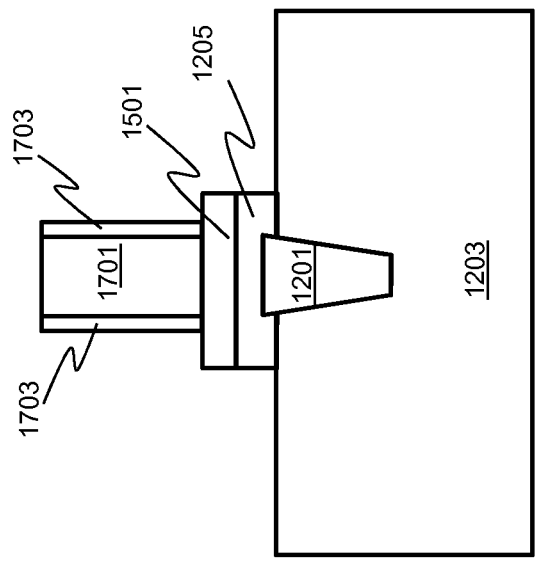
Figure 16:
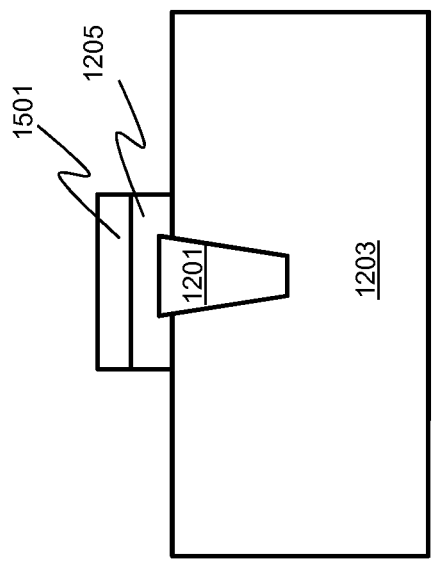

FIGS. 12 through 17 schematically illustrate another process flow for forming a SDB device including a protective bilayer. Adverting to FIG. 12, similar to FIG. 2, an oxide SDB 1201 is first formed in a Si substrate 1203. Next, a nitride layer 1205 is formed over the Si substrate 1203. The nitride layer 1205 may be formed, for example, to a thickness of 5 nm to 200 nm. A photoresist 1301 is then formed on the nitride layer 1205 with an opening 1303 above the SDB 1201, as depicted in FIG. 13. Similar to the photoresists 401 and 803 of FIGS. 4 and 8, respectively, the opening 1303 is formed with a width greater than the width of the SDB 1201. Adverting to FIG. 14, a recess 1401 is formed in the nitride layer 1205 through the opening 1303. The recess may be formed, for example, to a depth of 5 nm to 200 nm. The photoresist 1301 is then removed. Next, an oxide layer 1501 is formed over the nitride layer 1205, filling the recess 1401 (not shown for illustrative convenience). The oxide layer 1501 is then planarized down to the nitride layer 1205, as depicted in FIG. 15. Adverting to FIG. 16, the nitride layer 1205 is removed on opposite sides of the oxide layer 1501 down to the Si substrate 1203, for example, by etching. Again, a $SiO_2$ etch-stop layer (not shown for illustrative convenience) may also be added between the Si substrate 1203 and the nitride layer 1205. Thereafter, like in FIG. 10, a gate 1701 and spacers 1703 are formed on the oxide layer 1501, as depicted in FIG. 17.

The embodiments of the present disclosure can achieve several technical effects including protecting the Si fin tip area and the SDB oxide from damage and/or loss. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a single diffusion break (SDB) of oxide in a silicon (Si) substrate;
   forming a nitride layer directly on the Si substrate and on the SDB;
   forming an oxide layer over the nitride layer;
   forming a photoresist over the SDB, a portion of the nitride layer and a portion of the oxide layer;
   removing the nitride layer and the oxide layer on opposite sides of the photoresist down to the Si substrate, leaving a portion of the nitride layer and a portion of the oxide layer only under the photoresist;
   forming a gate above the SDB, the portion of the nitride layer; and the portion of the oxide layer.

2. The method according to claim 1, comprising forming the nitride layer to a thickness of 5 nanometer (nm) to 200 nm.

3. The method according to claim 1, comprising forming the photoresist with a width greater than a maximum width of the SDB.

4. The method according to claim 1, further comprising forming a silicon oxide ($SiO_2$) layer over the Si substrate prior to forming the nitride layer.

5. A method comprising:
   forming a single diffusion break (SDB) of oxide in a silicon (Si) substrate;
   forming a nitride layer directly on the Si substrate and on the SDB;

forming a photoresist layer on the nitride layer, the photoresist layer having an opening above the SDB and down to the nitride layer;

forming a recess in the nitride layer through the opening;

forming an oxide layer over the nitride layer and filling the recess;

removing the nitride layer on opposite sides of the oxide layer down to the Si substrate, leaving a portion of the nitride layer only under the oxide layer; and forming a gate on the oxide layer over the SDB.

6. The method according to claim 5, comprising forming the nitride layer to a thickness of 5 nanometer (nm) to 200 nm.

7. The method according to claim 5, comprising forming the opening above the SDB with a width greater than a maximum width of the SDB.

8. The method according to claim 5, comprising forming the recess to a depth of 5 nm to 200 nm.

9. The method according to claim 5, further comprising planarizing the oxide layer down to the nitride layer before removing the nitride layer.

* * * * *